United States Patent
Dick et al.

[11] Patent Number: 5,904,958
[45] Date of Patent: May 18, 1999

[54] ADJUSTABLE NOZZLE FOR EVAPORATION OR ORGANIC MONOMERS

[75] Inventors: Kenneth W. Dick, Charlotte; Richard L. Marshall, Matthews, both of N.C.

[73] Assignee: Rexam Industries Corp., Charlotte, N.C.

[21] Appl. No.: 09/045,086

[22] Filed: Mar. 20, 1998

[51] Int. Cl.$^6$ ................................................ C23C 16/00
[52] U.S. Cl. .................................. 427/248.1; 427/255.6; 118/719; 118/724; 118/726
[58] Field of Search ..................... 118/724, 726, 118/719; 427/248.1, 255.6

[56] References Cited

U.S. PATENT DOCUMENTS

| | | |
|---|---|---|
| 4,351,267 | 9/1982 | Kalbskopf et al. . |
| 4,417,540 | 11/1983 | Wohlfeil . |
| 4,562,095 | 12/1985 | Coulon et al. . |
| 4,600,390 | 7/1986 | Göbel et al. . |
| 4,667,879 | 5/1987 | Muller . |
| 4,696,719 | 9/1987 | Bischoff . |
| 4,842,893 | 6/1989 | Yializis .................. 427/255.6 |
| 4,880,163 | 11/1989 | Kobayashi et al. . |
| 4,954,371 | 9/1990 | Yializis .................. 427/255.6 |
| 5,097,800 | 3/1992 | Shaw ........................ 118/719 |
| 5,489,337 | 2/1996 | Nomura et al. . |
| 5,503,678 | 4/1996 | Usami . |

*Primary Examiner*—Richard Bueker
*Attorney, Agent, or Firm*—Alston & Bird LLP

[57] ABSTRACT

An apparatus for depositing a coating material, such as an organic monomer, in vapor form onto a substrate including a heated evaporation chamber having an inlet for introduction of the coating material into the chamber and a nozzle having an adjustable opening for adjusting cross direction coating uniformity. The nozzle may include a plurality of adjustment bolts spaced along the width of the nozzle for adjusting the opening of the nozzle. The adjustment bolts may be alternating push and pull adjustment bolts. Alternatively, the adjustable bolts are bolts having compound threads such that each bolt is capable of both pulling and pushing the adjustable opening of the nozzle. The substrate is preferably a moving web that defines the outer surface of a cooled drum. The apparatus further includes a radiation source positioned adjacent to the substrate for curing an organic monomer coating on said substrate. The radiation source may be an electron beam gun or an ultraviolet lamp. The evaporation chamber is operating under vacuum pressure of less than about 1 torr and preferably less than about $10^{-3}$ torr. The apparatus further includes a metal vaporization station positioned adjacent to the substrate for depositing an electrode material, such as aluminum, in vapor form onto the substrate. The nozzle may further include a nozzle plate securing the nozzle to the evaporation chamber.

19 Claims, 3 Drawing Sheets

ADJUSTABLE NOZZLE FOR EVAPORATION OR ORGANIC MONOMERS

FIELD OF THE INVENTION

This invention relates generally to methods and apparatus for forming organic polymer coatings and more particularly concerns nozzle configurations for evaporation of organic monomers.

BACKGROUND OF THE INVENTION

Organic polymer coatings can be produced by evaporating an organic monomer and condensing the monomer onto a chilled substrate. The monomer coating is then cured using an electron beam gun or ultraviolet radiation. Typically, the evaporation of the organic monomer is conducted in a vacuum environment. The monomer is sprayed or atomized into an evaporation chamber and vaporized. Temperatures in the evaporation chamber can reach about 550° F. Processes suitable for use with the present invention are disclosed in U.S. Pat. Nos. 4,842,893, 4,954,371, and 5,097,800, which are incorporated herein by reference.

The vaporized monomer builds gas pressure in the evaporation chamber until sufficient pressure is achieved to expel the vapor through a narrow slit in a nozzle positioned at the end of the chamber. The monomer condenses on a substrate placed adjacent to the nozzle opening. Typically, the substrate is placed against a chill drum to cool the surface of the substrate and promote condensation of the monomer. The coated substrate is then passed through a curing station where an electron beam gun or ultraviolet lamp initiates a polymerization reaction. In order to maintain machine direction coating uniformity, the monomer flow into the atomizer or spraying apparatus is precisely controlled. Additionally, the monomer stream and surrounding hardware must be continuously heated at a temperature sufficient to insure continuous atomization and vaporization of the monomer without significant dripping. The precise control of the atomization and vaporization of the monomer also contributes to machine direction or downweb coating uniformity.

However, the precise controls discussed above do not address transverse or cross-direction coating uniformity. Since the evaporation chamber and surrounding hardware must be continuously heated to high temperatures, thermal expansion will alter the machining tolerance of the narrow slot opening in the nozzle. A change in slot tolerance directly affects the transverse or cross-direction coating uniformity. Lack of cross-direction coating uniformity results in coatings of poor quality.

There is a need in the art for a method and apparatus for evaporation of organic monomer at high temperatures that minimizes the effect of thermal expansion upon cross-direction coating uniformity without significantly increasing the cost or complexity of the method and apparatus.

SUMMARY OF THE INVENTION

The present invention provides an apparatus for depositing a coating material, such as an organic monomer, in vapor form onto a substrate. The apparatus includes a heated evaporation chamber having an inlet for introduction of the coating material into the chamber. Additionally, the apparatus includes a nozzle having an adjustable opening for adjusting cross-direction coating uniformity. The nozzle is operatively positioned to receive vaporized coating material from the evaporation chamber. Additionally, the nozzle is positioned opposite the substrate to allow deposition of the coating material onto the substrate.

In one embodiment the adjustable opening of the nozzle comprises a plurality of adjustment bolts spaced along the width of the nozzle. These adjustment bolts may comprise alternating push and pull adjustment bolts. In another embodiment, the adjustable bolts are bolts having compound threads such that each bolt is capable of both pulling and pushing the adjustable opening of the nozzle. Preferably the substrate is a moving web that defines the outer surface of a cooled drum. In one embodiment, the apparatus further includes a radiation source positioned adjacent to the substrate for curing the monomer coating on the substrate. Advantageously, the radiation source is either an electron beam gun or an ultraviolet lamp. Preferably, the evaporation chamber is operated under vacuum pressure of less than about 1 torr. Most preferably, the vacuum pressure is less than about $10^{-3}$ torr. The apparatus may further include a metal vaporization station positioned adjacent to the substrate for depositing an electrode material, such as aluminum, in vapor form onto the substrate. Preferably, the apparatus of the present invention includes a nozzle plate for securing the nozzle to the evaporation chamber.

In a further embodiment, an apparatus is provided for continuously depositing multiple layers of organic monomer in vapor form onto a moving substrate. The apparatus includes a drum, cooled by an appropriate heat transfer fluid such as water, having an outer surface defined by the substrate. The drum rotates around an axis. The apparatus further includes at least one heated evaporation chamber under vacuum having an inlet for introduction of the organic monomer into the chamber. The apparatus also includes at least one nozzle having an adjustable opening for adjusting cross-direction coating uniformity and positioned to receive vaporized organic monomer from the evaporation chamber. The adjustable opening of the nozzle is positioned opposite the moving substrate. Additionally, the apparatus includes at least one radiation source positioned adjacent to the substrate for curing the monomer on the moving substrate. The apparatus includes at least one metal vaporization station positioned adjacent to the substrate for depositing an electrode material on the moving substrate. The nozzle includes a plurality of adjustment bolts spaced along the width of the nozzle. These adjustment bolts can either be push and pull adjustment bolts alternating along the width of the nozzle or bolts having compound threads so that each bolt is capable of both pulling and pushing the adjustable opening.

A method of depositing a coating material in vapor form onto the substrate is also provided. The method involves heating the nozzle to a predetermined operating temperature and adjusting the nozzle opening to obtain cross-direction coating uniformity at the predetermined operating temperature. The method further includes vaporizing the coating material and passing the vaporized coating material through the nozzle having an adjustable opening. Preferably, the coating material comprises an organic monomer and the method further includes the step of curing the condensed organic monomer coating. Advantageously, the method may further include depositing an electrode material onto the substrate. The curing step preferably comprises applying ultraviolet radiation to the organic monomer coating.

BRIEF DESCRIPTION OF THE DRAWINGS

Figure 1:
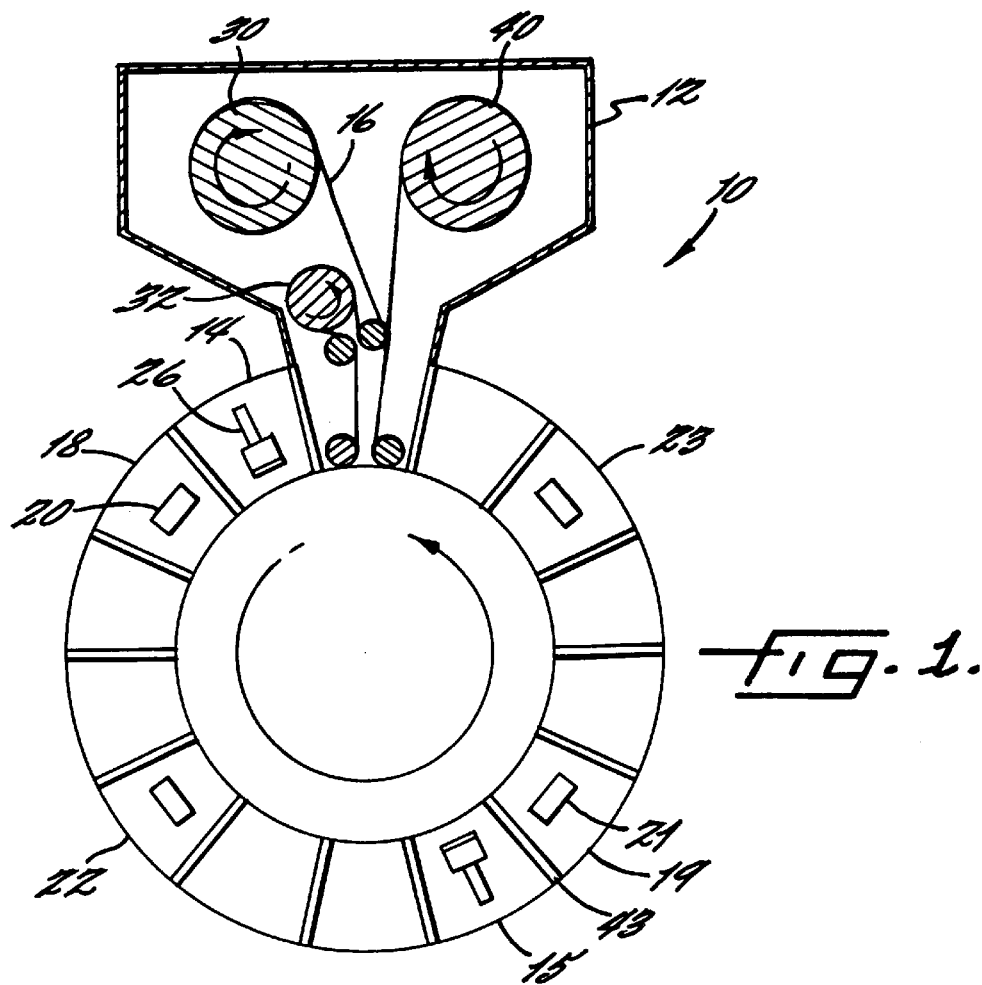
Figure 2:
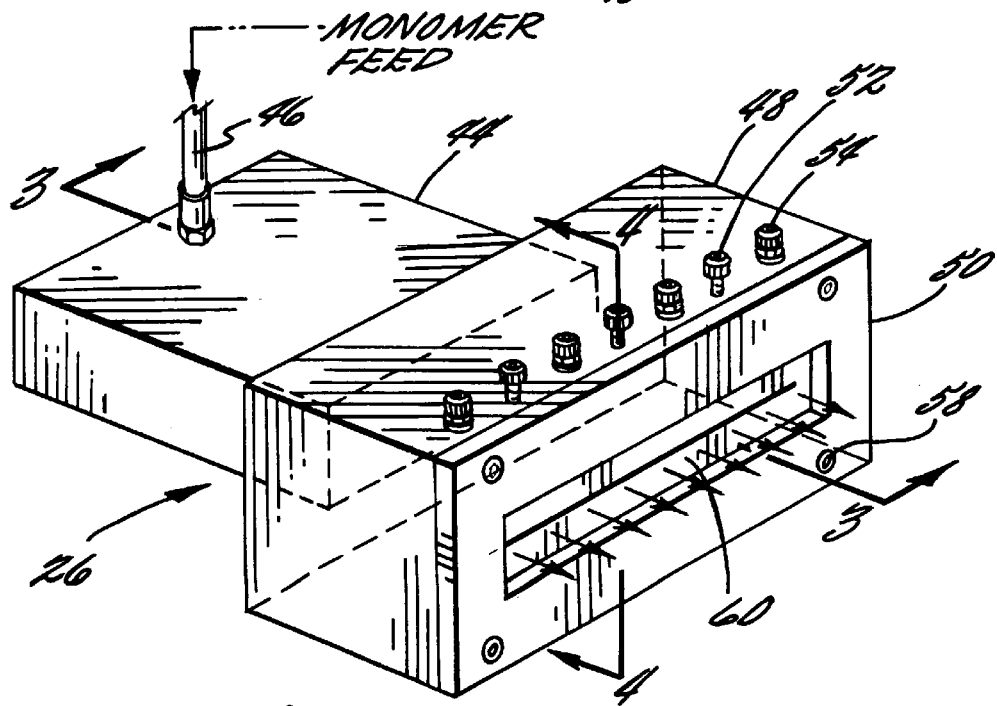
Figure 3:
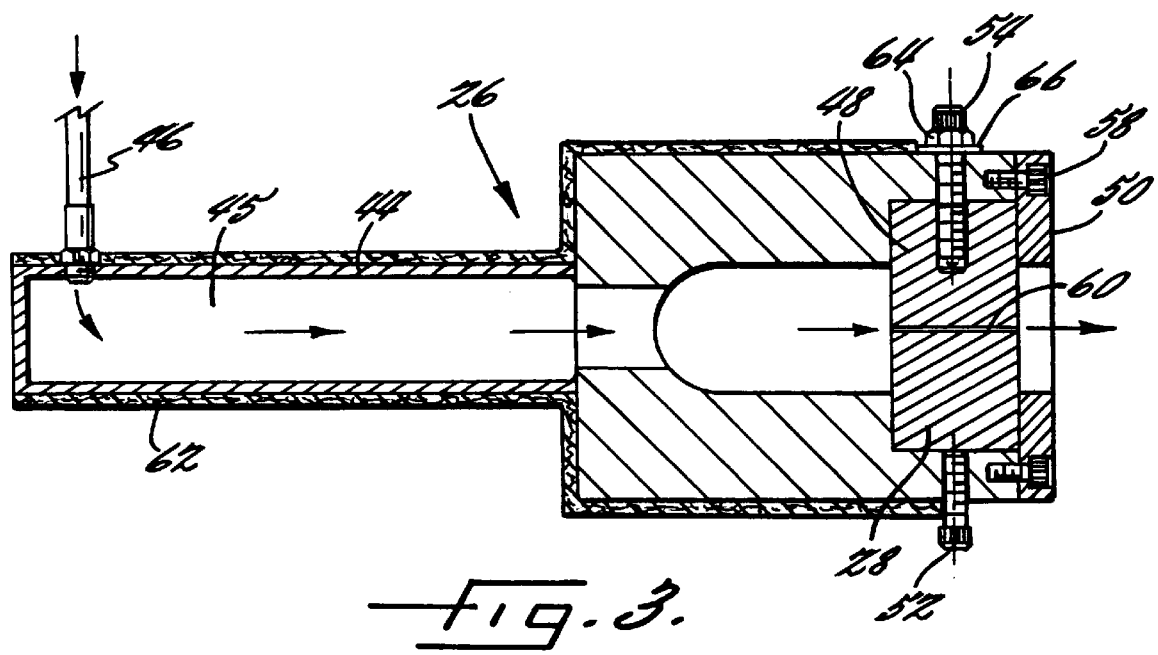
Figure 4:
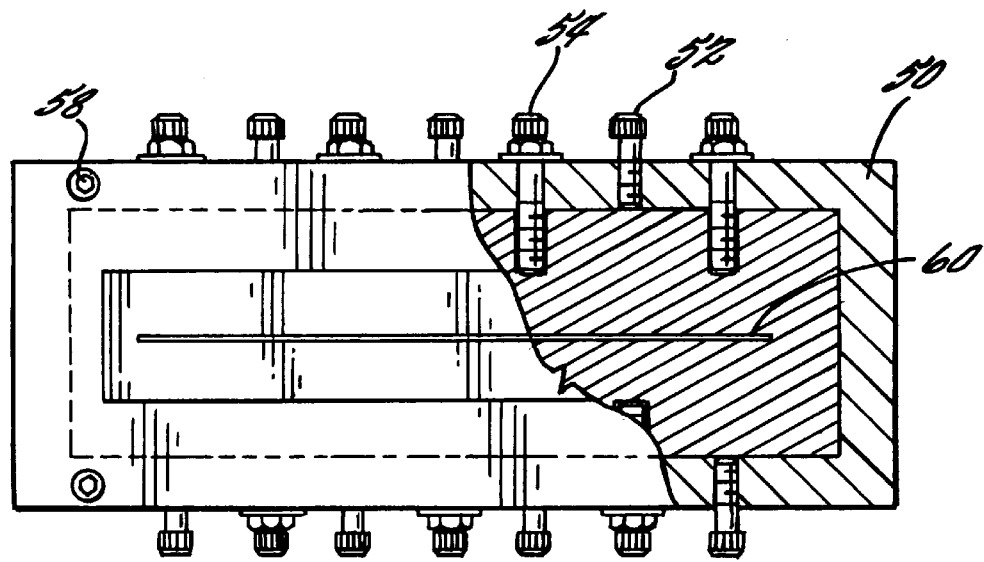
Figure 5:
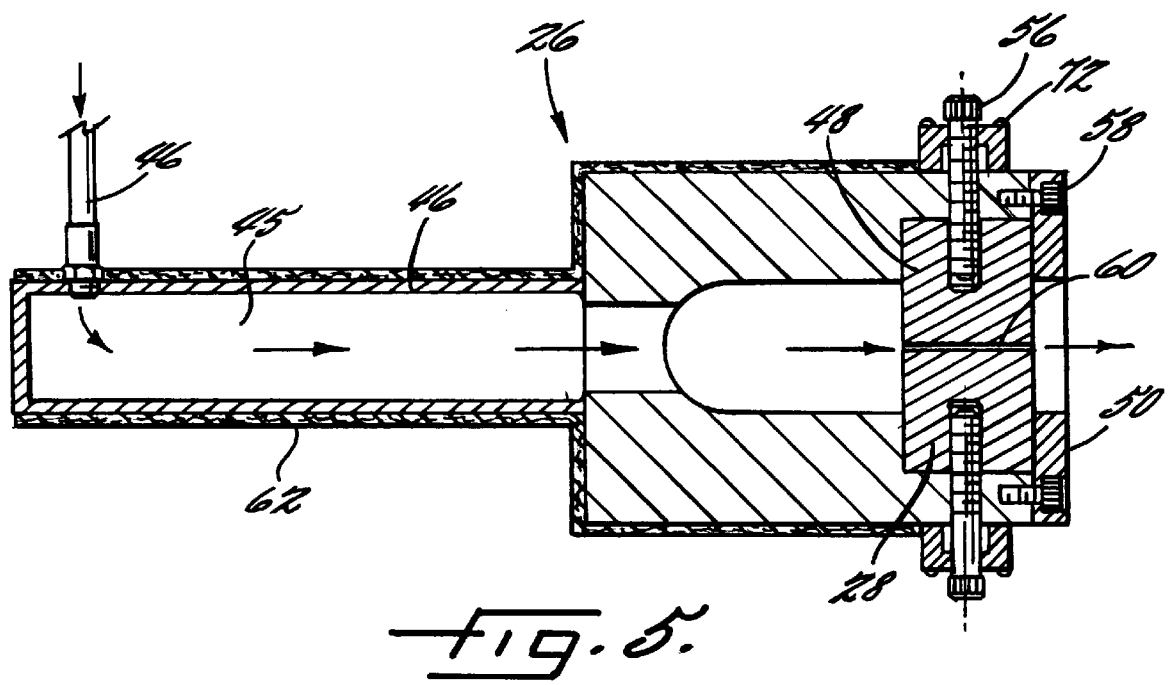
Figure 6:
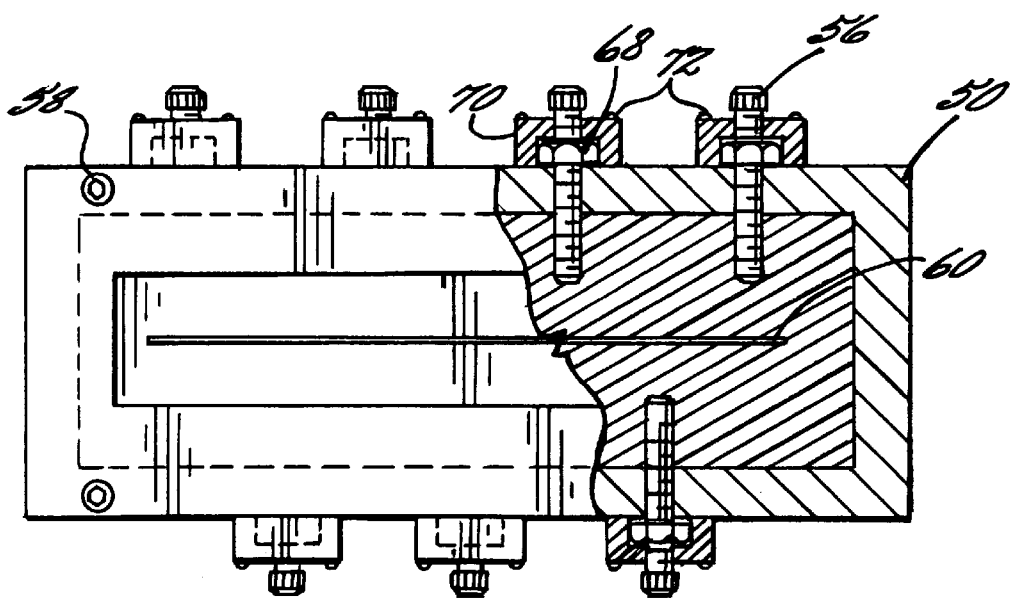

Having thus described the invention in general terms, reference will now be made to the accompanying drawings, which are not necessarily drawn to scale, and wherein:

FIG. 1 is a schematic view of the coating apparatus of the present invention;

FIG. 2 is a perspective view of a first embodiment of the nozzle and evaporation chamber of the present invention;

FIG. 3 is a sectional view of a first embodiment of the nozzle and evaporation chamber of the present invention taken along the line 3—3 of FIG. 2;

FIG. 4 is a front view, partially sectioned, of a first embodiment of the nozzle of the present invention taken along line 4—4 of FIG. 2;

FIG. 5 is a sectional view of a second embodiment of the nozzle and evaporation chamber of the present invention; and FIG. 6 is a front view, partially sectioned, of a second embodiment of the nozzle of the present invention.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

The nozzle of the present invention is preferably employed in a one pass vapor deposition process carried out within a vacuum chamber. Such a process may be used to form multi-layer coated products, such as metallized sheet materials. A suitable apparatus for carrying out this process is shown schematically in FIG. 1. The apparatus of FIG. 1 contains multiple coating and curing stations for forming successive coatings on a moving substrate.

Referring to FIG. 1, a continuous multi-station coating apparatus is indicated generally by the reference character 10. The entire apparatus is housed within a vacuum chamber 12. In a preferred embodiment, the vacuum chamber is operated under a vacuum in the range of from about $10^{-3}$ to $10^{-5}$ torr. It is believed that coating in a vacuum eliminates gases that form undesired reactions and impede flow of material from deposition processes. The coating apparatus 10 will be described as including two pre-polymer coating stations and two metallized coating stations. However, it will be evident to one of ordinary skill in the art that the apparatus 10 illustrated in FIG. 1 may be modified to form a coated material having a fewer or greater number of coating layers.

In the preferred embodiment, a substrate 16 is supplied in the form of a continuous sheet stored on a rotatable supply reel 30. The substrate 16 may be of any suitable material depending of the nature of the coating process and the desired product. Examples of suitable materials include paper, metal and the like. The substrate 12 is unwound from the rotatable supply reel 30 and is routed around a face chill roll 32 and then around a guide roll 34 and onto the surface of a rotatable drum 36. The feed guide roll 34 is mounted adjacent to the drum 36 and serves to feed the substrate onto the surface of the drum 36 and maintain a predetermined degree of tension on the substrate sheet 16. The face chill roll 32 is cooled by a circulating coolant in order to chill the surface of the substrate sheet 16. The substrate 16 is a moving web that defines the outer surface of the rotatable drum 36. As the substrate sheet 16 is rotated with the drum 36, it passes by a number of stations that effect the coating process.

A take up guide roll 38 is mounted adjacent to the drum 36 at a location adjacent to the feed guide roll 34. The take up guide roll 38 maintains a predetermined degree of tension on the substrate sheet 16 and guides the substrate sheet from the drum 36 to the product reel 40. After passing the coating process stations, the coated substrate sheet 16 is wound around the product reel 40.

Before undergoing the coating process, the substrate sheet 16 may be subjected to a pretreatment process to improve coating adhesion. Conventional surface treatment techniques such as plasma treatment, corona discharge, flame treatment and the like can be applied to the substrate sheet 16 before the substrate is placed in the chamber. Alternatively, an in-line pretreatment may be carried out using a conventional plasma gun (not shown) positioned within the camber prior to the first coating deposition station.

After pre-treatment, the substrate sheet 16 is preferably rotated past a first vapor deposition station 14. The vapor deposition station 14 contains an evaporator 26. As shown in FIGS. 2–6, the evaporator 26 includes an evaporation body 44 that defines an evaporation chamber 45. The evaporator 26 further includes a nozzle housing 28 communicating with the evaporation chamber 45. A nozzle 48 is mounted to the evaporator 26 at the nozzle housing 28. The nozzle 48 has an elongate narrow slot opening 60 through which the vaporized coating material flows for deposition onto the substrate. The nozzle 48 includes an adjustment mechanism, described in detail below, for adjusting the width of the elongate slot opening 60. Typically, the elongate slot opening 60 is about 0.010 inches to about 0.10 inches in width. The length of the elongate slot opening 60, as well as the length of the nozzle housing 28 and nozzle 48, depend upon the width of the substrate sheet 16 to be coated. The organic monomer enters the evaporation chamber 45 of the evaporator 26 through an inlet 46. In the preferred embodiment, the nozzle 48 is held to the nozzle housing 28 by a nozzle plate 50 shown in FIGS. 2–6. The nozzle plate 50 is bolted to the nozzle housing 28 using bolts 58.

The monomer may be any suitable monomer material depending on the product desired. Suitable organic monomers include polyfunctional acrylic monomers. The chosen monomer should be radiation curable and capable of flash evaporation in a vacuum chamber at a temperature below the thermal decomposition temperature of the monomer and below a temperature at which polymerization occurs in less than a few seconds. Preferably, the monomer has an average molecular weight in the range of about 150 to 600.

The organic monomer is initially de-gassed to remove any entrained gasses. Advantageously, the de-gassing operation comprises applying a vacuum to the container holding the monomer while stirring the monomer (not shown). The de-gassed monomer is then atomized or sprayed into the evaporation chamber 44 where it is vaporized. The evaporator 26 is heated by a heating jacket 62, as shown in FIG. 3. The heating jacket may affect heating of the evaporator 26 by any conventional means, including electric resistance heating, steam or other fluid heating and the like.

The monomer enters the evaporator 26 in droplet form. Passing the liquid monomer through an atomizer (not shown), such as an ultrasonic atomizer, is the preferred method of forming the monomer droplets that enter the evaporator 26. An atomizer suitable for use with the present invention is disclosed in U.S. Pat. No. 4,696,719, which is incorporated herein by reference. Dripping the liquid monomer onto a rotating disk is another method of forming the monomer droplets for entry into the evaporator 26. The monomer flow to the atomizer is controlled by a precise pumping system. Advantageously, a syringe pump is used wherein the pump plunger is moved by a precision motor and gearbox combination (not shown). It is important to continually heat the monomer stream and surrounding hardware to avoid excessive formation of drips during the atomizing and vaporizing processes.

As the monomer is continually fed into the heated evaporator 26 and vaporized, the gas pressure within the evaporator increases. The pressure within the evaporation chamber 45 eventually forces the monomer vapor through the elongate slot opening 60 of the nozzle 48 which is positioned adjacent to the substrate sheet 16. The monomer condenses on the substrate sheet 16 to form an uncured coating. The rotatable drum 36 positioned against the substrate sheet 16 is cooled or chilled, thereby encouraging condensation of the monomer onto the substrate sheet. Preferably, the rotatable drum 36 is water cooled, although other heat transfer fluids may be employed as will be understood by those skilled in the art.

During the coating process, the evaporation chamber 44 and the nozzle 48 are continuously heated to extreme temperatures. In some cases, the evaporation chamber temperature reaches approximately 550° F. At such temperatures, thermal expansion alters the machining tolerance of the elongate slot opening 60. To counteract the effects of thermal expansion on the elongate slot opening 60, the nozzle 48 of the present invention includes a plurality of adjustment bolts spaced along the longitudinal extent of the elongate slot opening 60.

In the embodiment shown in FIG. 2, the adjustment bolts comprise alternating "push" bolts 52 and "pull" bolts 54. As shown in FIGS. 3 and 4, the push bolts 52 are threaded into the nozzle housing 28 and bear against the nozzle 48. As the push bolts 52 are tightened, a closing force is applied to the elongate slot opening 60. The pull bolts 54 pass through a clearance hole in the evaporation chamber 44 and are threaded into the nozzle 48. A jam nut 64 and flat washer 66 are installed on each bolt to facilitate adjustment. The pull bolts 54 apply opening force to the elongate slot opening 60.

An alternative embodiment is illustrated by FIGS. 5 and 6. In this embodiment, the separate push-pull adjustment bolts are replaced with compound threaded bolts 56. The compound threaded bolts 56 have a series of relatively course threads near the bolt head. The end of the bolt has a smaller diameter and relatively fine threads. The coarse threads near the bolt head are threadably engaged with a square nut 68 that is securely held to the nozzle housing 28 by a saddle 70. The fine threads at the end of the bolt are threaded into the nozzle 48 before the saddle 70 is bolted to the nozzle housing 28 using the saddle bolts 72. The relatively course threads near the bolt head that are engaged with the square nut 68 have a greater pitch than the relatively fine threads engaged with the nozzle 48. The difference in pitch angle between the two sets of threads allow rotation in one direction to decrease the effective length of the bolt and rotation in the opposite direction to increase the effective length of the bolt. This results in each bolt having a push-pull effect on the elongate slot opening 60 that can be used to both open and close the slot opening without resorting to separate bolts to push and pull the opening.

To adjust the elongate slot opening 60, the evaporator 26 is heated to the predetermined operating temperature. The operating temperature varies depending upon certain process parameters such as the boiling point of the monomer to be coated. A conventional thickness or feeler gauge is used to set the spacing of the slot opening, and the adjustment mechanism is adjusted as necessary to obtain the desired uniformity of slot spacing across the entire extent of the slot and to thus compensate for any variation in the elongate slot opening 60 caused by thermal expansion. As described above, the adjustment bolts may be rotated to apply a pushing or pulling force on the elongate slot opening 60, as needed to obtain cross direction coating uniformity, i.e. uniform slot width across the elongate slot opening 60. Advantageously, the adjustment procedure is conducted while the vacuum chamber 12 is at atmospheric pressure. The nozzle 48 of the present invention thus allows control of transverse or cross-direction coating uniformity.

After the nozzle 48 is adjusted to compensate for thermal expansion, the vacuum chamber 12 may be evacuated and the coating process may begin. Once the monomer is vaporized and condenses on the substrate sheet 16, as described above, the substrate sheet 16 passes a curing station 18 as shown in FIG. 1. The curing station 18 provides a source of radiation for initiating a polymerization reaction within the monomer coating to produce a cured polymer coating. Preferably, the curing station 18 contains a UV lamp 20 that provides UV radiation for curing. Alternatively, an electron beam gun could be used as the radiation source for curing purposes. Advantageously, a baffle 42 separates the vapor deposition station 14 from the curing station 18 to prevent uncondensed monomer in the vapor deposition station 14 from floating downstream into the curing station 18 and contaminating the cured coating.

If desired, the substrate sheet 16 may then pass a metal vaporization station 22 mounted adjacent to the rotatable drum 36. The metal vaporization station 22 deposits a thin layer or film of metal coating onto the surface of the polymer coating. The metal material can be deposited by use of any conventional deposition techniques such as vacuum metallizing, sputtering and the like. A preferred metallizing material is aluminum.

Upon leaving the metal vaporization station 22, the substrate sheet 16 may pass another vapor deposition station 15 containing the evaporator 26 and nozzle 48 of the present invention. The vapor deposition station 15 deposits an additional monomer coating onto the substrate sheet 16. The substrate sheet 16 then passes a second curing station 19 for curing of the second monomer coating. Advantageously, the second curing station 19 contains a second UV lamp 21 that provides ultraviolet radiation for curing purposes. Advantageously, a second baffle 43 is placed between the second vapor deposition station 15 and the second curing station 19 to prevent uncured monomer from contaminating the cured polymer layer on the substrate sheet 16. If desired, the substrate sheet 16 can then be passed by a second metal vaporization station 23 which deposits an additional thin film of metal to the substrate sheet 16.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. An apparatus for depositing a coating material onto a substrate, comprising:

a vacuum chamber;

means in said vacuum chamber for advancing a substrate along a path of travel;

an evaporator located within said vacuum chamber, said evaporator including an inlet for receiving a coating material, a heated evaporator chamber for vaporizing the coating material, and a nozzle housing communicating with said evaporator chamber and located adjacent the path of travel of the substrate; and a nozzle mounted to said evaporator at said nozzle housing, said nozzle having an elongate narrow slot opening through which the vaporized coating material flows for being deposited onto the substrate, and an adjustment mechanism for adjusting the width of said slot opening.

2. An apparatus according to claim 1, wherein said adjustment mechanism comprises a plurality of adjustment bolts extending into said nozzle housing at spaced locations along the longitudinal extent of the elongate slot opening.

3. An apparatus according to claim 2, wherein said adjustment bolts comprise both push and pull adjustment bolts.

4. An apparatus according to claim 3, wherein said push and pull adjustment bolts are alternated along the longitudinal extent of the elongate slot opening.

5. An apparatus according to claim 2, wherein said adjustable bolts are bolts having compound threads such that each bolt is capable of both pulling and pushing said elongate slot opening.

6. An apparatus according to claim 1, wherein said adjustment mechanism comprises at least one bolt threadably engaged with said nozzle and at least one bolt threadably engaged with said nozzle housing and bearing against said nozzle.

7. An apparatus according to claim 1, wherein said adjustment mechanism comprises a plurality of bolts extending into said nozzle housing at spaced locations along the longitudinal extent of the elongate slot opening, some of said bolts being threadably engaged with said nozzle housing and bearing against said nozzle and some of said bolts being threadably engaged with said nozzle.

8. An apparatus according to claim 1, wherein said adjustment mechanism comprises a plurality of bolts having compound threads, said bolts extending through a nut and into said nozzle housing at spaced locations along the longitudinal extent of the elongate slot opening, said bolts being threadably engaged with said nozzle and threadably engaged with said nut, said compound threads comprising relatively fine threads extending into said nozzle and relatively course threads extending through said nut, said nut being affixed to said nozzle housing.

9. An apparatus according to claim 1, wherein said means for advancing a substrate along a path of travel comprises a moving web defining the outer surface of a cooled drum.

10. An apparatus according to claim 1, further comprising a nozzle plate securing said nozzle to said nozzle housing.

11. An apparatus for depositing a coating material onto a substrate, comprising:

a vacuum chamber;

means in said vacuum chamber for advancing a substrate along a path of travel, said means comprising a moving web defining the outer surface of a cooled drum;

an evaporator located within said vacuum chamber, said evaporator including an inlet for receiving coating material, a heated evaporator chamber for vaporizing the coating material, and a nozzle housing communicating with said evaporator chamber and located adjacent the path of travel of the substrate; and a nozzle mounted to said evaporator at said nozzle housing, said nozzle having an elongate narrow slot opening through which the vaporized coating material flows for being deposited onto the substrate, and an adjustment mechanism for adjusting the width of said slot opening, said adjustment means comprising a plurality of bolts having compound threads, said bolts extending through a nut and into said nozzle housing at spaced locations along the longitudinal extent of the elongate slot opening, said bolts being threadably engaged with said nozzle and threadably engaged with said nut, said compound threads comprising relatively fine threads extending into said nozzle and relatively course threads extending through said nut, said nut being affixed to said nozzle housing.

12. An apparatus for depositing a coating material onto a substrate, comprising:

a vacuum chamber;

means in said vacuum chamber for advancing a substrate along a path of travel, said means comprising a moving web defining the outer surface of a cooled drum;

an evaporator located within said vacuum chamber, said evaporator including an inlet for receiving a coating material, a heated evaporator chamber for vaporizing the coating material, and a nozzle housing communicating with said evaporator chamber and located adjacent the path of travel of the substrate; and a nozzle mounted to said evaporator at said nozzle housing, said nozzle having an elongate narrow slot opening through which the vaporized coating material flows for being deposited onto the substrate, and an adjustment mechanism for adjusting the width of said slot opening, said adjustment mechanism comprising a plurality of bolts extending into said nozzle housing at spaced locations along the longitudinal extent of the elongate slot opening, some of said bolts being threadably engaged with said nozzle housing and bearing against said nozzle and some of said bolts being threadably engaged with said nozzle.

13. An apparatus for depositing a coating material onto a substrate, comprising:

a vacuum chamber;

a cooled drum rotating around an axis within said vacuum chamber and having an outer surface, said outer surface defined by said substrate;

an evaporator located within said vacuum chamber, said evaporator including an inlet for receiving coating material, a heated evaporator chamber for vaporizing the coating material, and a nozzle housing communicating with said evaporator chamber and located adjacent the path of travel of the substrate;

a nozzle mounted to said evaporator at said nozzle housing, said nozzle having an elongate narrow slot opening through which the vaporized coating material flows for being deposited onto the substrate, and an adjustment mechanism for adjusting the width of said slot opening;

a radiation source positioned adjacent the path of travel of the substrate for curing said monomer on said substrate; and a metal vaporization station positioned adjacent the path of travel of the substrate for depositing an electrode material on said moving substrate.

14. An apparatus according to claim 13, wherein said adjustment mechanism comprises a plurality of bolts extending into said nozzle housing at spaced locations along the longitudinal extent of the elongate slot opening, some of said bolts being threadably engaged with said nozzle housing and bearing against said nozzle and some of said bolts being threadably engaged with said nozzle.

15. An apparatus according to claim 13, wherein said adjustment mechanism comprises a plurality of bolts having compound threads, said bolts extending through a nut and into said nozzle housing at spaced locations along the longitudinal extent of the elongate slot opening, said bolts being threadably engaged with said nozzle and threadably engaged with said nut, said compound threads comprising relatively fine threads extending into said nozzle and relatively course threads extending through said nut, said nut being affixed to said nozzle housing.

16. An apparatus according to claim 13, wherein said radiation source is selected from the group consisting of electron beam gun and ultraviolet lamp.

17. A method of depositing a coating material in vapor form onto a substrate, comprising the steps of:

heating a nozzle having an elongate slot opening to a predetermined operating temperature;

adjusting the nozzle to obtain cross direction coating uniformity at the predetermined operating temperature by rotating a plurality of bolts spaced along the longitudinal extent of the elongate slot opening;

vaporizing the coating material;

passing the coating material through the elongate slot opening of the nozzle; and condensing said coating material onto the substrate.

18. A method according to claim 17, further comprising the step of curing the condensed coating material.

19. A method according to claim 17, further comprising the step of depositing an electrode material onto said substrate.

* * * * *